(12) United States Patent     (10) Patent No.: US 8,957,802 B1
Evans     (45) Date of Patent: Feb. 17, 2015

(54) METASTABILITY ERROR DETECTION AND CORRECTION SYSTEM AND METHOD FOR SUCCESSIVE APPROXIMATION ANALOG-TO-DIGITAL CONVERTERS

(71) Applicant: Cadence Design Systems, Inc., San Jose, CA (US)

(72) Inventor: William Pierce Evans, Catonsville, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/026,880

(22) Filed: Sep. 13, 2013

(51) Int. Cl.
    *H03M 1/38*     (2006.01)
    *H03M 1/46*     (2006.01)

(52) U.S. Cl.
    CPC . *H03M 1/46* (2013.01); *H03M 1/38* (2013.01)
    USPC .......................................... 341/161; 341/155

(58) Field of Classification Search
    USPC ............................ 341/172, 118, 163, 155, 161
    See application file for complete search history.

(56) References Cited

U.S. PATENT DOCUMENTS 5,017,814 A *   5/1991   Lloyd ............................. 327/198
6,603,415 B1 *   8/2003   Somayajula .................. 341/118
8,344,925 B1    1/2013   Evans
8,482,449 B1 *   7/2013   Zabroda ......................... 341/172
2014/0043175 A1 *   2/2014   Fogleman et al. ............ 341/110

OTHER PUBLICATIONS

Jing Yang, et al., A 1-GS/s 6-bit 6.7mW ADC in 65-nm CMOS, IEEE CUstom Integrated Circuits Conference Proceedings, 2009, IEEE p. 287-290.

* cited by examiner

*Primary Examiner* — Brian Young
(74) *Attorney, Agent, or Firm* — Rosenberg, Klein & Lee

(57) ABSTRACT

A system and method are provided for the detection and correction of metastability errors in a successive approximation analog to digital converter (ADC). The successive approximation ADC (40) includes a comparator unit (424) that includes a NAND gate circuit (550) that outputs a comp_rdy_n signal when the comparator (500) has latched a result. ADC (40) includes a metastability detection and correction circuit (425) that includes a first logic circuit (700) that monitors the comp_rdy_n signal and detects a metastable event if that signal is not received within a portion of a conversion time period of the ADC. Responsive to detection of a metastable event, a second logic circuit (750) generates a correct conversion code at the output of the ADC. If no metastable event is detected during a conversion cycle of the ADC, the second logic circuit (750) outputs the conversion codes determined by the comparator (500).

24 Claims, 8 Drawing Sheets

METASTABILITY ERROR DETECTION AND CORRECTION SYSTEM AND METHOD FOR SUCCESSIVE APPROXIMATION ANALOG-TO-DIGITAL CONVERTERS

BACKGROUND OF THE INVENTION

The present invention is generally directed to a system for detecting metastability errors in successive approximation analog-to-digital converters and method thereof. More specifically, the subject system and method provide for a successive approximation analog-to-digital converter (ADC) having a comparator unit that includes a circuit for output of a signal responsive to the comparator latching a result. Further, the system and method are directed to a successive approximation analog-to-digital converter that includes a metastability detection and correction circuit that monitors the signal output by the comparator unit responsive to the comparator latching a result and detects a metastable event by an absence of that signal by the end of a portion of the ADC conversion time period for a bit. Responsive to detection of a metastable event, a logic circuit is provided for generating a correct conversion code at the output of the ADC. If no metastable event is detected during a conversion cycle of the ADC, the metastability detection and correction circuit outputs the conversion codes determined by the comparator.

Of the various types of analog-to-digital converters (ADC), the successive approximation ADC architecture has long been favored in many applications requiring high speed, low power consumption, and suitably high conversion resolution. The successive approximation ADC that is shown in FIG. 1 is a design that has been recently patented by the present inventor and provides a good starting point for understanding the invention described herein. For conversion to an n-bit digital word, the successive approximation ADC 10, shown in FIG. 1, generally operates to sample an analog input signal voltage via input 118 and then carry out a binary search for the corresponding quantized level to be coded via the n-bit word. The binary search is carried out over each of the bit positions in the n-bit word, with a comparator 124 compares the sampled input signal voltage provided from a sample and hold included in element 122, against a succession of voltage reference levels provided from the switched capacitor digital-to-analog converter (DAC) of element 122. This comparison is thereby made for each successive "state" of the n-bit word as it is updated, bit-by-bit, in the successive approximation register (SAR) 116 of the successive approximation ADC 10.

The voltage reference levels for the states are successively provided according to an SAR logic state machine 102 of the successive approximation ADC 10. The levels are set for each state by the internal reference DAC 122 relative to a reference voltage $V_{REF}$ provided by the reference generator 120. For each state, the SAR logic state machine prescribes the voltage reference level according to the quantization value then defined by the n-bit digital word.

A successive approximation ADC processing cycle thus includes a sampling phase followed by a conversion phase, during which a series of bit determinations are successively made. This cycle is repeated for subsequent samples of the input analog signal. With advances in device technologies, such as deep submicron semiconductor technologies, there is an increasing demand for greater speed of the successive approximation ADC processing cycle.

One of the limitations to increasing the processing speed is the time required for the comparator to make a valid decision. When there is a small differential in the input to the comparator, it will take longer for the comparator to make its decision and which if not made within the time allotted, will result in a large conversion error at random times. One solution, provided in the successive approximation ADC of FIG. 1, includes a circuit in the comparator 124 that detects when the comparator has made a decision and in response thereto outputs a data ready signal on line 112 to the clock generator 104, which then causes the SAR logic state machine 102 to advance to the next state. In this way, as shown in the timing diagram of FIG. 2, the processing is asynchronous with the clocking of the SAR logic state machine 102 and the comparator 124 being adaptively generated by the clock generator 104. In this manner, bit determinations are only delayed when required and otherwise proceeds at a maximum rate in accordance with settling and propagation times of the components of the successive approximation ADC.

One known method of producing high speed successive approximation ADCs is to place multiple ADCs in parallel, as shown in FIG. 3, and clocking the converters 300a-300n in sequence, each converting a respective analog voltage supplied from a sample and hold circuit (not shown) on input line 306. When using parallel ADCs 300a-300n, it is advantageous to have the ADCs share a common reference 302 for good gain matching between the converters. When sharing the reference 302, it is advantageous to clock each ADC 300a-300n with a common clock, input on line 304, so that the voltage reference is perturbed at the clock period and has the same time to settle after this clock before each comparator is sampled in the parallel ADCs 300a-300n.

With the asynchronous successive approximation ADC of FIG. 1, the comparator has a data ready output which indicates when the comparator 124 has made a decision. When the differential inputs of the comparator are close together in value, near the metastable point, it will take a longer period of time for the comparator to make a decision and for the data ready line to be asserted. Once the data ready line is asserted, the clock generator circuitry 104 then generates a new clock pulse to advance the SAR circuitry 116 to the next state to determine the next bit. The problem with this approach is that the time at which the SAR logic state machine 102 advances to the next state is uncertain, which means that the time that the switched capacitor DAC 122 is switched to the next setting is uncertain.

Since when the switched capacitor DAC switches, it puts a transient load on the reference generator 120, the noise on this voltage reference occurs at indeterminate times. Therefore, if this reference is shared between a number of parallel ADCs 300a-300n, as shown in FIG. 3, the noise caused by one ADC may corrupt the reference voltage of one of the other ADCs when it's comparator is clocked, resulting in an erroneous output.

SUMMARY OF THE INVENTION

A system for detection and correction of metastability errors in a conversion of a sampled analog signal by a successive approximation analog to digital converter coupled to a reference generator is provided. The successive approximation analog to digital converter includes a clock generator coupled to a successive approximation register and a logic state machine, and a digital to analog converter coupled to the successive approximation register, the logic state machine and the reference generator. The system includes a comparator unit operatively coupled to the digital to analog converter and the sampled analog signal and has an output coupled to the successive approximation register. The comparator unit initiates a comparison of the sampled analog signal with a quantization level reference established by the digital to analog converter responsive to a comparator clocking signal. After a time interval, the comparator unit outputs a signal corresponding to the comparator unit latching a bit value respectively for each of a plurality of bit conversion states. The comparator unit outputs the latched bit value to the successive approximation register. The system further includes a metastability detection and correction circuit coupled to the successive approximation register, the logic state machine and the clock generator. The metastability detection and correction circuit is further coupled to the comparator unit for detecting a metastable event therein and outputs bit values received from the successive approximation register responsive to an absence of a metastable event, and outputs selected bit values responsive to detection of at least one metastable event within a processing cycle of the successive approximation analog to digital converter.

From another aspect, a system for detection and correction of metastability errors in a conversion of a sampled analog signal by a successive approximation analog to digital converter is provided. The system includes a comparator unit for the successive approximation analog to digital converter that has an output coupled to a successive approximation register of the successive approximation analog to digital converter. The comparator unit initiates a comparison of the sampled analog signal with a quantization level reference established by the successive approximation analog to digital converter responsive to a comparator clocking signal, and subsequently outputs a signal corresponding to the comparator unit latching a bit value respectively for each of a plurality of sequential bit conversion states of the successive approximation analog to digital converter. The comparator unit outputs the latched bit value to the successive approximation register. Further, the system includes a metastability detection and correction circuit coupled to the successive approximation register, the logic state machine and a clock generator. The metastability detection and correction circuit is further coupled to the comparator unit for detecting a metastable event therein and outputting bit values received from the successive approximation register responsive to an absence of a metastable event and output of selected bit values responsive to detection of at least one metastable event within a processing cycle of the successive approximation analog to digital converter to provide an output bit value within each conversion time period of the processing cycle of the successive approximation analog to digital converter.

From yet another aspect, a method of detecting and correcting metastability errors in a successive approximation analog to digital converter is provided. The method includes the steps of sampling an analog voltage, and sequentially establishing a quantization level reference for each of a plurality of bit conversion states of a processing cycle using a successive approximation algorithm. The method further includes the step of using a comparator to sequentially perform a clocked comparison between the sampled analog voltage and the quantization level reference for each bit conversion state. Further, the method includes the step of determining whether the comparator has latched an output bit value within a portion of a conversion time period and defining an occurrence of a metastable event for a respective bit conversion state responsive to a failure of the comparator to latch an output bit value within the portion of the conversion time period. Still further, the method includes the step of setting a value of an output bit corresponding to the respective bit conversion state coincident with the metastable event to a logic one and each less significant bit value sequentially thereafter within the processing cycle to a logic zero.

DESCRIPTION OF THE PREFERRED EMBODIMENTS

Figure 1:
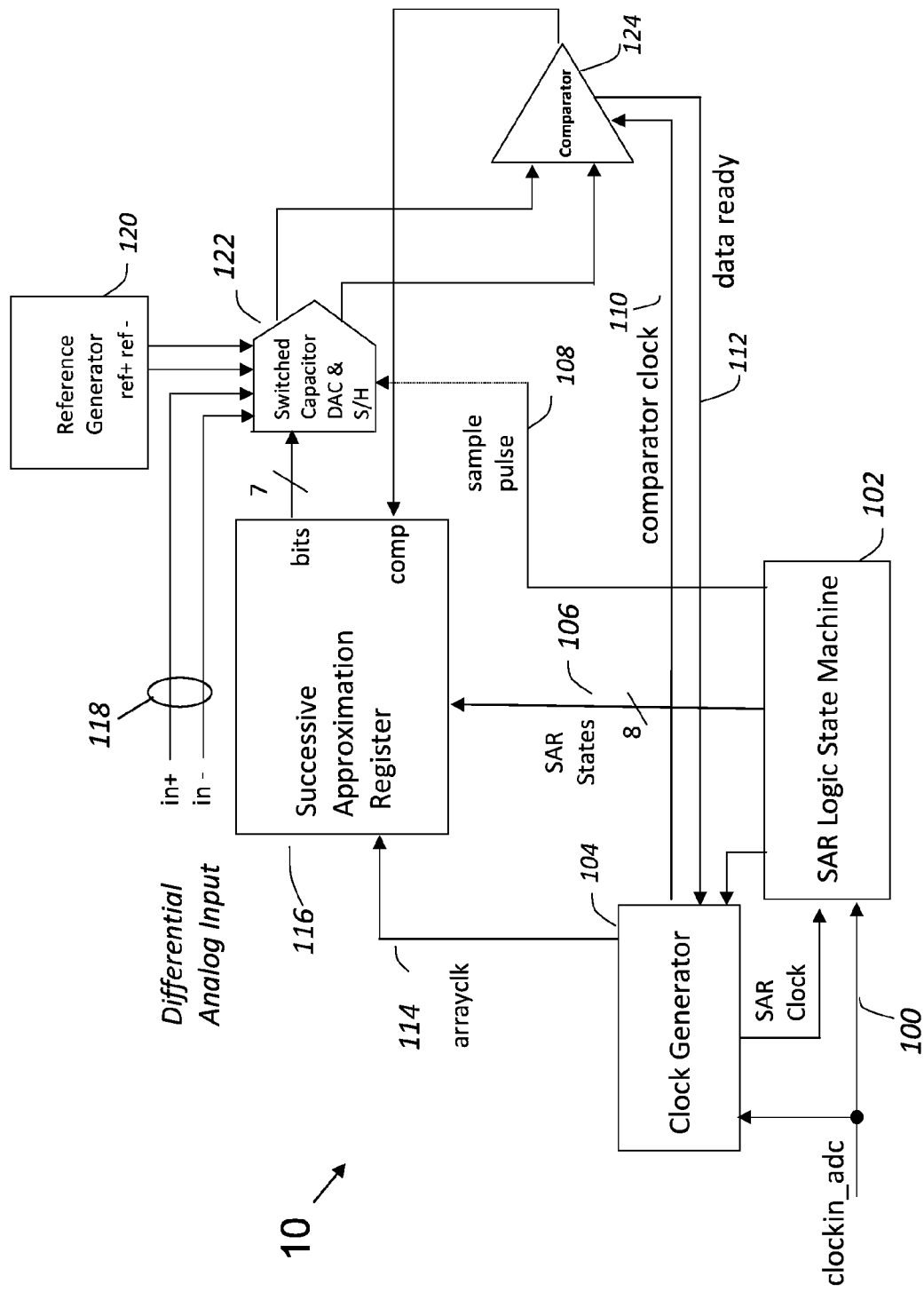
FIG. 1 is a block diagram of a related successive approximation analog to digital converter system.
Figure 2:
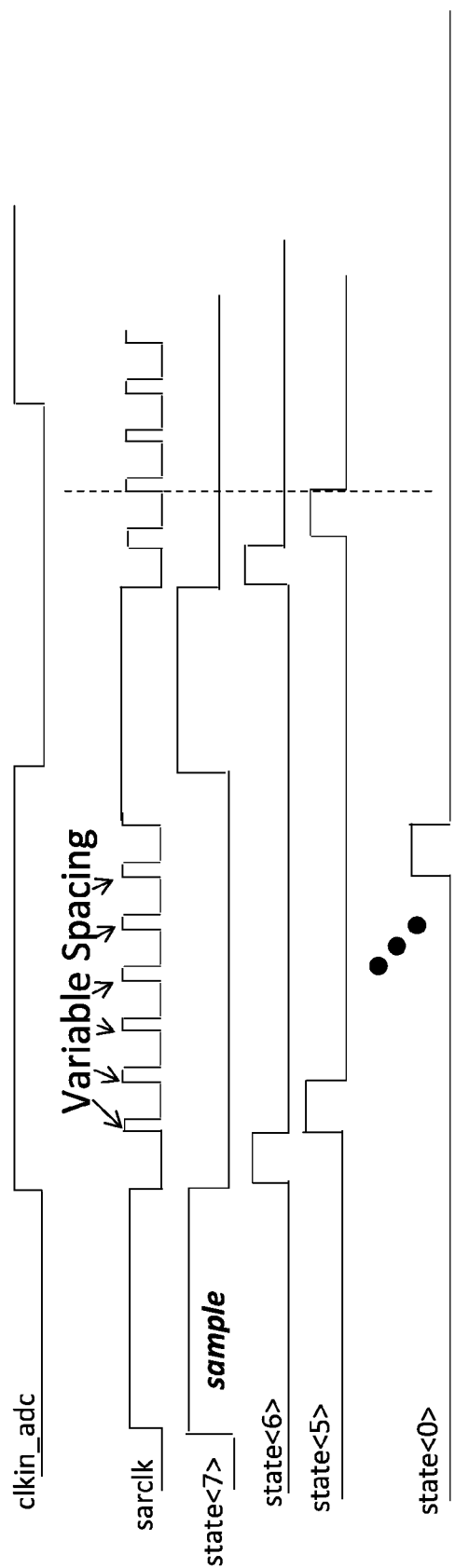
FIG. 2 is a timing diagram showing waveforms of the successive approximation analog to digital converter of FIG. 1.
Figure 3:
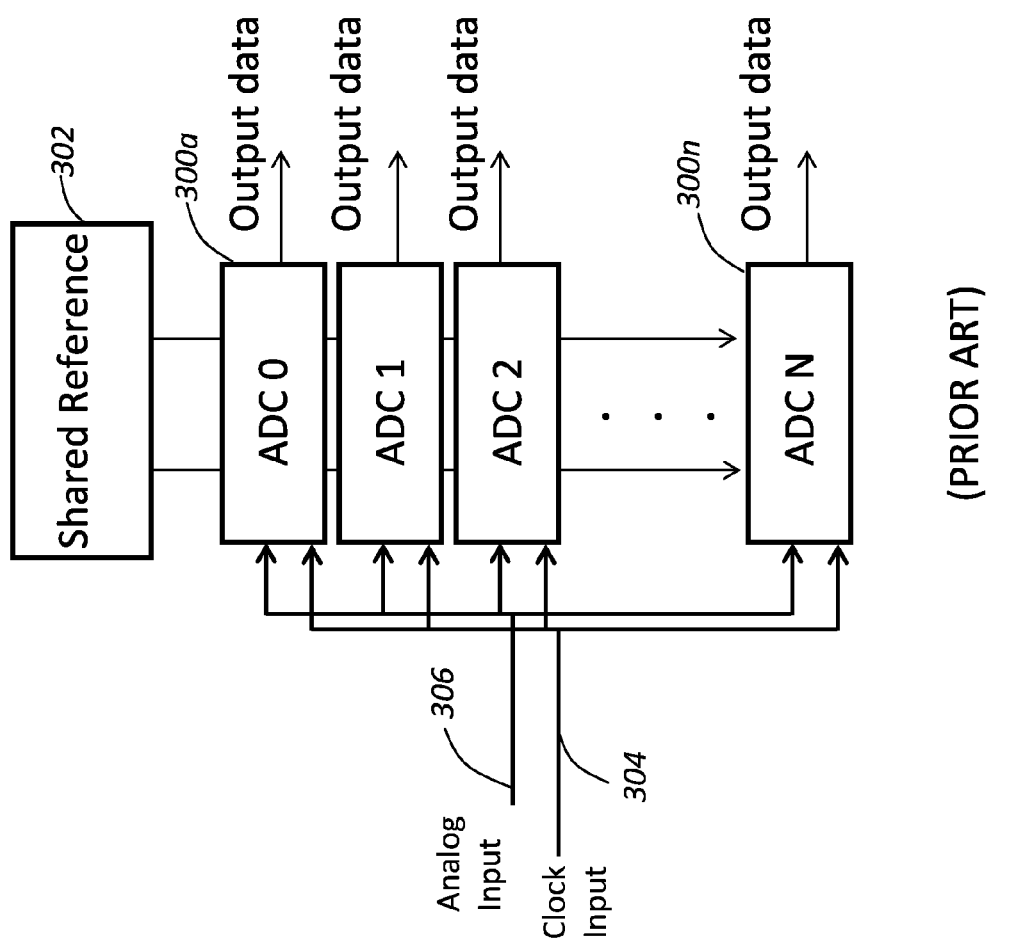
FIG. 3 s a block diagram of a conventional parallel analog to digital converter system.
Figure 4:
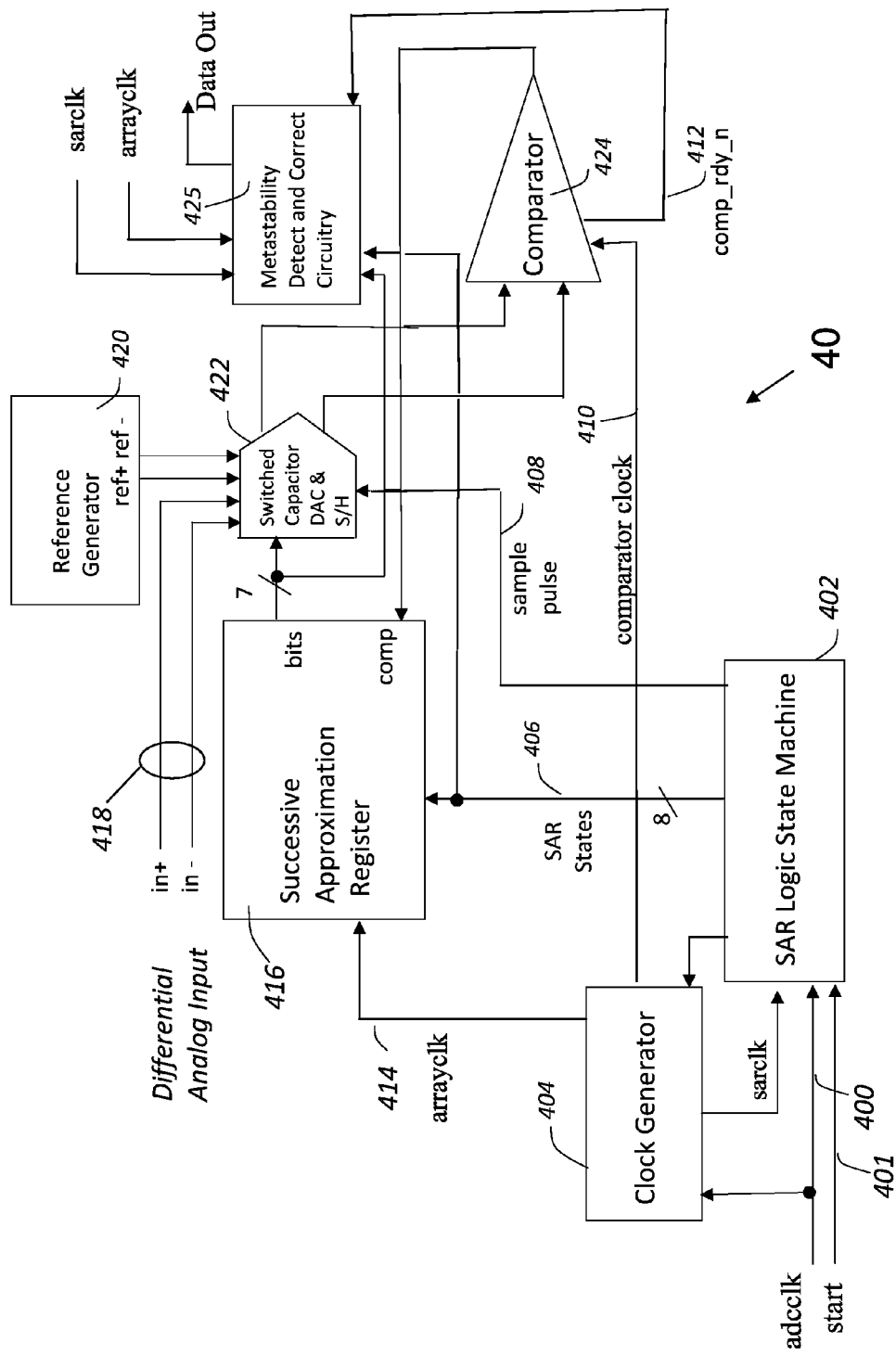
FIG. 4 is a block diagram illustrating an interconnection of operational units in a successive approximation analog to digital converter system formed in accordance with a exemplary embodiment of the present invention.

Referring to FIGS. 4-8, there is shown a successive approximation analog to digital convertor (ADC) system 40 employing circuitry 425 for detecting the occurrence of a metastable event in the comparator unit 424 and providing a correction therefore. Referring specifically to FIG. 4, successive approximation ADC system 40 includes elements found in conventional successive approximation ADC systems. Successive approximation ADC system 40 includes a successive approximation register (SAR) 416, an SAR logic state machine 402, a digital-to-analog converter (DAC) and sample/hold (S/H) unit 422, clock generator 404 and a reference generator 420 combined with a comparator unit 424 and metastability detection and correction circuitry 425, preferably inter-coupled as shown. Although separately shown, it should be recognized that the SAR 416 may be formed as part of SAR logic state machine 402.

The successive approximation ADC processing cycle includes a sampling phase followed by a bit conversion phase. During the sampling phase, the S/H portion of unit 422 samples and holds (for the subsequent bit conversion phase) an analog input voltage provided on the input lines 418, which in the illustrated example happens to be of differential voltage type. During the bit conversion phase which follows, a series of bit determinations are successively made to arrive at the converted digital word for the sampled analog voltage. This processing cycle is repeated for subsequent samples of the input analog signal.

Each successive approximation ADC processing cycle is actuated according to a start signal on line 401. Preferably, the sampling phase is carried out during a first logic state of the SAR logic state machine 402. The adcclk signal on line 400 advances the state machine through successive states. The SAR logic state machine 402 outputs a sample pulse signal on line 408 to the DAC and S/H unit 422 to set the sampling phase of the conversion cycle. The adcclk signal is also coupled to the clock generator 404 which generates an sarclk signal coupled to the SAR logic state machine 402, and an arrayclock signal coupled to the SAR 416 by line 414

The SAR logic state machine 402 operates generally to keep track of when the system is in sampling phase and when it is in bit conversion phase. State machine unit 402 actuates the sampling and conversion phase of the processing cycle upon triggering by the start signal. Through the conversion phase, the SAR logic state machine 402 successively determines and stores each bit of a digital word of predetermined bit length n in SAR 416. This is carried out through a corresponding number of states, preferably beginning with the most significant bit (MSB) of the n-bit digital word, successively on down to the least significant bit (LSB). For the seven bit example shown in FIG. 4, the sampling state and seven bit conversion states are identified by the eight state lines 406 output from the SAR logic state machine 402.

SAR logic state machine 402 thus operates to actuate a binary search for the n-bit quantized level closest to the sampled analog input voltage, relative to a predetermined reference voltage. The sampled analog input voltage is compared during the binary search against respective voltage reference levels set according to a series of quantization values, as coded by the n-bit digital word over successive states. Although not important to the inventive concepts disclosed herein, the system employs a differential capacitor DAC in the DAC portion of the DAC and S/H unit 422 and a differential comparator in the comparator unit 424, which is well known in the art of successive approximation analog to digital convertors. With respect the novel concepts being disclosed herein, a single ended DAC and corresponding comparator could be employed as well. As is known in the art, the differential output of the DAC and S/H unit 422 is supplied to the comparator unit 424. The comparator unit 424 is clocked via the comparator clock signal (comp_clk) on line 410 to compare the differential voltage, which is derived from sampled analog and reference voltages, at each state, and the digital word in the SAR unit 416 is accordingly updated based on the comparison result that is output thereto.

To convert the sampled voltage to an n-bit digital word, such comparisons are carried out over a series of at least n successive states for each of the n-bits. In the illustrated example, the n-bit reference DAC portion of unit 422 is identified as being a switched capacitor type DAC, but may be any suitable type known in the art without departing from the inventive concepts disclosed herein. The DAC operates in conjunction with the reference generator 420, that supplies a voltage across the terminals ref+ and ref−, to supply the reference voltage ($V_{REF}$) for each state of processing at a voltage level in scaled proportion to the coded value of the n-bit digital word (SAR word) then set for the given state (relative to the maximum coded value), as is conventionally done in the art.

The conversion phase preferably begins with the SAR logic state machine 402 clearing then initializing the SAR 416 $n^{th}$ state. That is, all but the $n^{th}$, or most significant, bit of the stored digital word is cleared to its logic low value. The resulting n-bit SAR digital word, having just its MSB set to a logic high value, is passed to the reference DAC of unit 422 which generates a voltage quantization reference level $V_{DAC}(n)$ for this $n^{th}$ state by correspondingly scaling $V_{REF}$ according to the coded modular value of the n-bit digital word in the SAR at this state. Depending on the comparison of the sampled input voltage with the reference level $V_{DAC}(n)$, the logic high value set for the $n^{th}$ bit of the SAR word by the SAR logic state machine is either kept at that logic value or reset to its logic low value.

SAR logic state machine 402 successively moves on through the remaining states, carrying out much the same operation for each SAR state from the next state on down until the LSB is reached and suitably processed. For each successive SAR state, the state's corresponding bit in the n-bit SAR word is set to its logic high value while all the lesser significant bits therefrom are maintained at their logic low values. The reference level $V_{DAC}(i)$ for each successive state, or bit position, i is selectively set according to the coded value of the digital word then stored in the SAR 416. The effect of this is to approximate the quantization level for the sampled analog voltage in successively closer increments to converge at its digital conversion, namely the n-bit word remaining in the SA register after due processing of all states.

The embodiment illustrated in FIG. 4 is configured to provide, for example, a 7 bit successive approximation ADC. The conversion phase comprises in this case 7 bit conversion states <6>, . . . , <0>. This is in addition to the preceding sampling phase, of course, which may be considered a separate state, state <7>, of a processing cycle. In any event, the bit conversion phase begins with state <6> where the MSB of the SAR word is determined by the reference DAC setting the appropriate reference value, with the comparator then comparing the sampled analog voltage to that reference value. The states count down in order from there, with the next six less significant bits of the SAR word being successively determined in states <5> through <0>. The LSB is determined at state <0>.

During each of these bit conversion states, the reference DAC of unit 422 is afforded sufficient time to settle on the appropriate reference level for comparison before the comparator is clocked to compare the sampled analog voltage thereto, as is typically done in this art. When comparator unit 424 is clocked in state <6> of the conversion phase of processing, the MSB of the SAR word is either kept at a logic 1 or set to a logic 0, depending on the output of comparator unit 424.

State machine unit 402 then moves on to the next state <5>, where the next bit (MSB-1) is set to a logic 1, and the reference DAC is given time to settle to the appropriate voltage level to serve as a comparison reference for the SAR word at this state. Comparator unit 424 is then clocked for this state <5> by clock generator 404, and the output of the comparator determines whether the MSB-1 bit is kept at logic 1 or set to a logic 0. The remaining bits of the SAR word are similarly determined in successive states <4>, . . . , <0> of the SAR logic state machine 402. Once the last bit (LSB) is determined, state machine unit 402 returns to the sampling phase, and the next sample of the analog input voltage signal is taken, and the value of the newly sampled analog voltage is accordingly used a subsequent conversion phase of a next ADC processing cycle.

Figure 5:
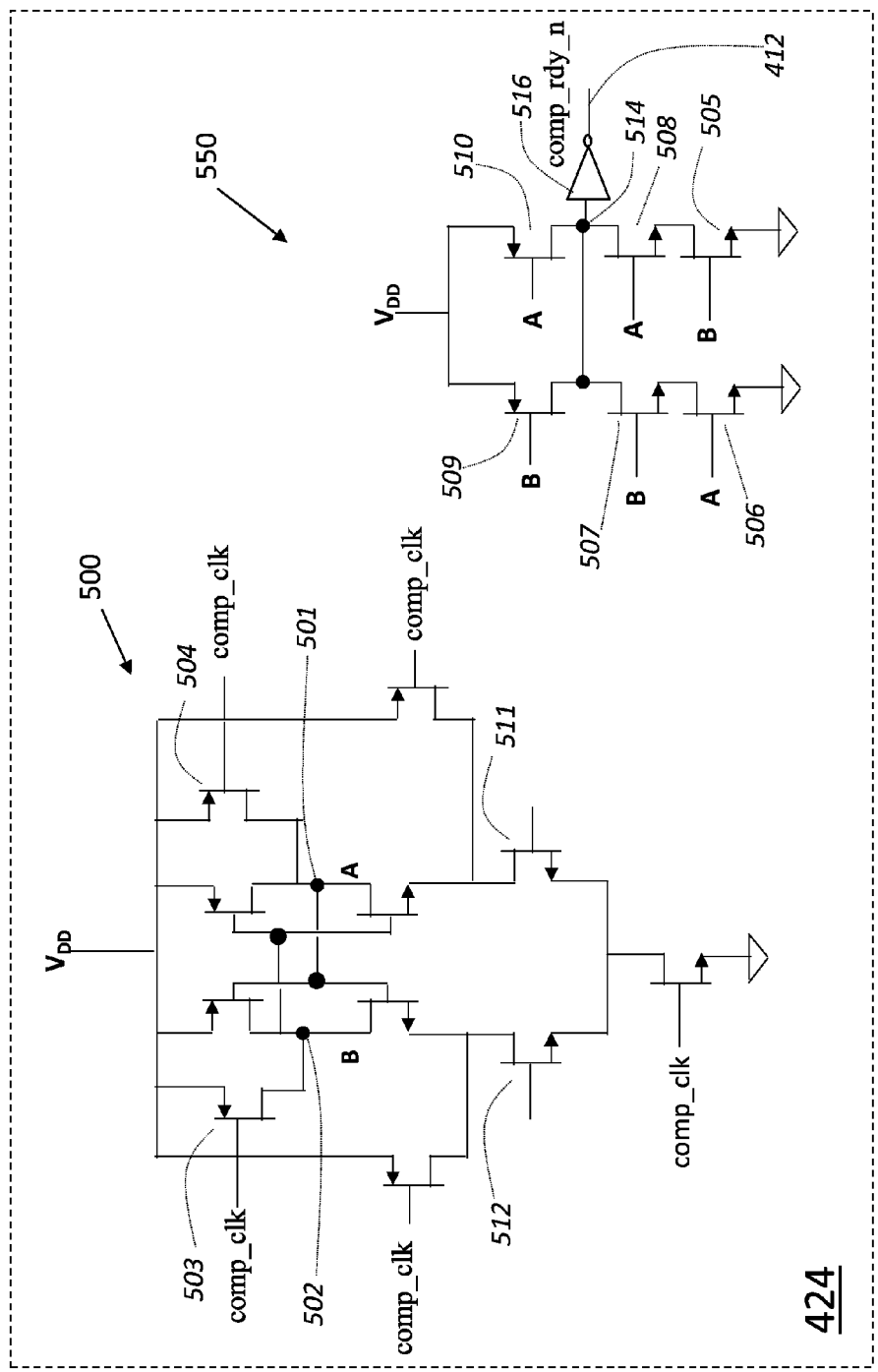
FIG. 5 is a simplified schematic diagram illustrating portions of an exemplary comparator unit implementation employed in the successive approximation analog to digital converter system of FIG. 4.

Referring further to FIG. 5, there is shown, a simplified schematic for portions of a latched comparator circuit employed by comparator unit 424 in accordance with one exemplary embodiment of the present invention. The illustrated comparator circuit 500 of unit 424 is often referred to as a "strong arm comparator" and is set to a latched state when the comp_clk signal goes high. Conversely, when the comparator clock signal goes low, the comparator circuit is set to an unlatched state, whereby the two nets (collection of electrically connected terminals) 501 (labeled A) and 502 (labeled B) are held at a supply voltage $V_{DD}$ preferably by PMOS switches 503, 504.

A high-going transition of the comp_clk signal causes the two PMOS switches 503 and 504 to open (turn OFF), and the circuit assumes a regenerative latch state where both nets 501 and 502 initially start falling from their $V_{DD}$ voltage levels. Depending on input voltages applied at the gate terminals of transistors 511 and 512, then, one of the two nets, 501 or 502, goes high to $V_{DD}$ while other goes low, ground potential, through positive feedback. The comparator circuit output will then be latched.

The two nets 501, 502 are disposed to respectively feed the gate terminals of transistors 506, 508, 510 and 505, 507, 509, which together form a NAND gate circuit 550 whose output defines a comparator ready (comp_rdy) signal at the output net 514 that is inverted by inverter 516 to define the comp_ready_n signal output on line 412. The NAND gate 550 arrangement presents a balanced load input to the nets 501 and 502. When either of the nets 501, 502 drops below a threshold of NAND gate 550, the gate's output 514 goes high, since one of the PMOS transistors 509, 510 closes, its corresponding NMOS transistors 506, 507 or 505, 508 opens. This sets the inverted comparator ready signal comp_ready_n to a logic low, which is sent to the metastability detection and correction circuitry 425 via line 412, as shown in FIG. 4, indicating that the comparator circuit is latched. If neither of the nets 501, 502 drops below a threshold of the NAND gate 550, the output 514 of NAND gate 550 goes/remains low and the output 412 of inverter 516 goes/remains high, since both PMOS transistors 509, 510 are open, and their corresponding NMOS transistors 506, 507 and 505, 508 are closed. This sets the inverted comparator ready signal comp_ready_n that is sent to the metastability detection and correction circuitry 425 to a logic high level, indicating that the comparator circuit is unlatched (not ready).

Looking further at the operation of the comparator 500, when comp_clk is low, the nets 501 and 502 are pulled high to $V_{DD}$ by transistors 503 and 504. When the comp_clk signal goes high, the nets 501 and 502 are disconnected from VDD and the voltage at nets 501 and 502 appear as shown in the diagram in FIG. 6. Looking at the first clock period of two clock periods shown in FIG. 6, a metastable event is shown. A metastable event occurs when the two input voltages to the gates of transistors 511 and 512 of the comparator 500 are approximately equal in magnitude. In this situation, the voltages at nets 501 and 502 will only spread apart slowly due to the positive feedback of the comparator and only when net 501 drops below the level which turns off transistors 506 and 508 of NAND gate 550 will the comp_rdy signal at the output net 514 go high, as shown in FIG. 6.

Figure 6:
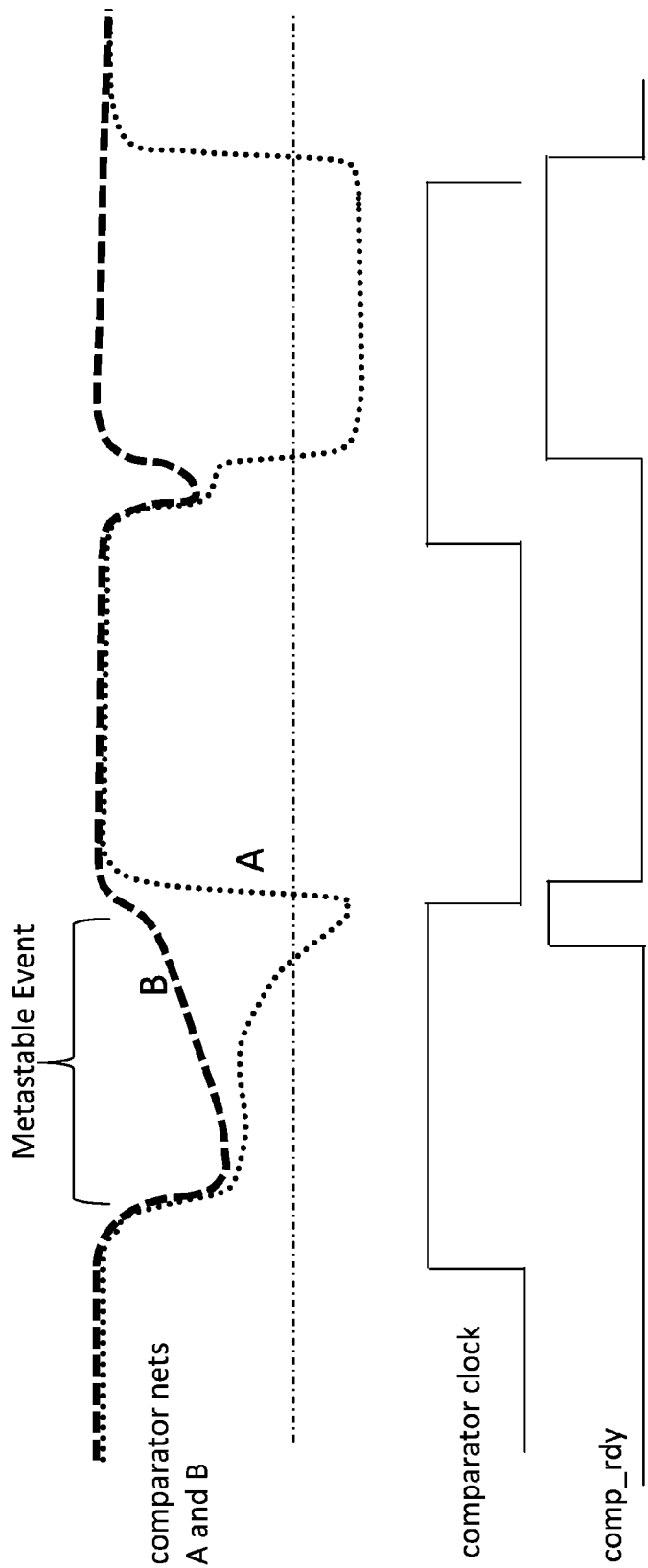
FIG. 6 is a timing diagram illustrating internal analog voltage waveforms of FIG. 5 and the comparator clock and comparator ready (comp_rdy) signal to illustrate normal operation and a metastable event.

During the second period shown in FIG. 6, the difference between the inputs to the gates of the comparator transistors 511 and 512 are farther apart when the comparator is latched and the nets 501 and 502 more quickly move apart after the comparator clock goes high, as a result of the inputs to the gates of the comparator transistors 511 and 512 not being equal. Thus, during the second clock period, the comparator 500 is far from metastability condition. Under this circumstance, the comparator ready signal, comp_rdy, goes high much sooner, during an early portion of the processing cycle of the successive approximation ADC system 40, than was the case in the previous clock period when a metastable event occurred. The rapid latching of the comparator 500 within a short time period, a period less than fifty percent of a conversion time period following the transition of the comp_clk signal enables sufficient time for the other circuitry of successive approximation ADC system 40 to complete the conversion within the processing cycle of the successive approximation ADC system 40.

The metastability detection and correction circuitry 425 makes use of the inverted comp_rdy signal, comp_rdy_n, output by inverter 516 on line 412 in conjunction with the two clock signals sarclk and arrayclk from the clock generator 404, the arrayclk signal being used in an inverted form arrayclk_n, to detect when a metastable event has occurred. The occurrence of a metastable event can cause a large conversion error output from a successive approximation ADC.

Figure 7:
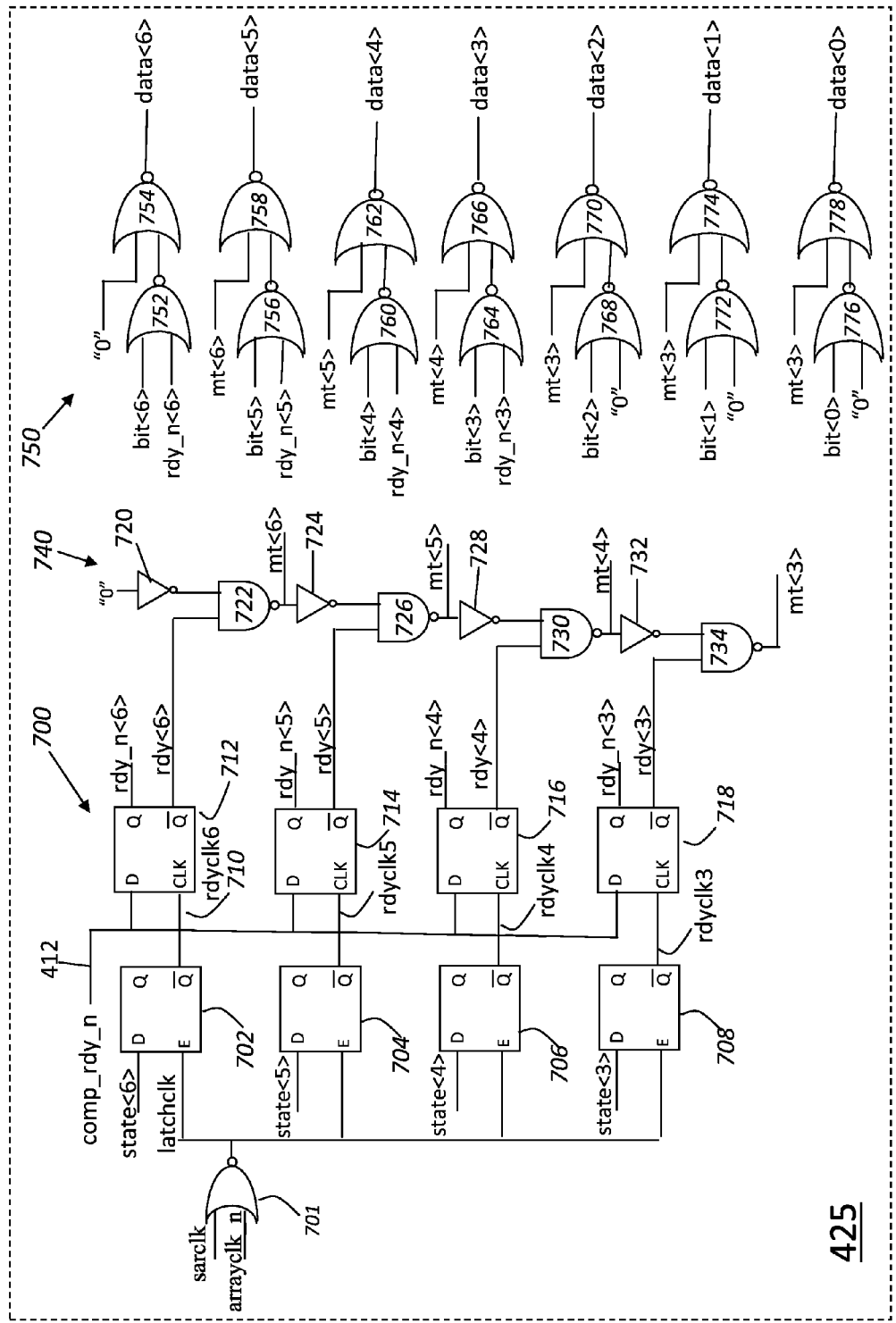
FIG. 7 is a logic diagram illustrating an exemplary metatable detection and correction circuit implementation employed in the successive approximation analog to digital converter system of FIG. 4.

Referring now to FIG. 7, there is shown a logic diagram for the metastability detection and correction circuitry 425. Metastability detection and correction circuitry 425 includes a first logic circuit 700 for detection of metastable events and a second logic circuit 750 for correction of the output of the successive approximation ADC system 40 when a metastable event is detected.

The first logic circuit 700 establishes the timing for detection of a metastable event through the generation of a latch clock signal latchclk. The sarclk and arrayclk_n signals are coupled to the NOR gate 701 to generate a short positive pulse train, the latchclk signals, as shown in the timing diagram of FIG. 8 that are output to the E (enable) input of the latch devices 702, 704, 706, and 708. When the latchclk signal goes high, the latch devices 702, 704, 706, and 708 are in transparent mode and the D input is transferred to the latch output Q. The latch output Q is the inverted form of the output Q. When the latchclk signal goes low, the latches will hold their values at that time. The four latches 702, 704, 706 and 708 generate four output clocks which will be used to clock the comp_rdy_n signal into the four D type flip flops 712, 714, 716, and 718. Latch 702 outputs a rdyclk6 signal on line 710 to the clock input (CLK) of D type flip flop 712. Likewise, Latch 704 outputs a rdyclk5 signal to the clock input of D type flip flop 714, latch 706 outputs a rdyclk4 signal to the clock input of D type flip flop 716, and latch 708 outputs a rdyclk3 signal to the clock input of D type flip flop 718. These flip flops will capture and store metastability events for any of the first four MSBs of the ADC in the 7 bit ADC example illustrated. When a metastability event occurs in the MSB of an N bit ADC, the size of the error generated is $2^{(N-2)}$. In the 7 bit ADC illustrated in the example being discussed, the error would have a magnitude of 32 codes. If the next bit has a metastable error, the magnitude would be 16 codes. The following two bits would have an error magnitude of 8 codes and 4 codes, respectively.

In the example illustrated in FIGS. 4-8, no attempt is made to detect a metastable error for bits 2, 1, and 0 because the size of the errors generated would be 2 LSBs or less and would generally be insignificant for most applications. Therefore, in order to save chip area and power, there are no latches and associated D flip flops for those bits. However, the number of latch stages and corresponding D flip flops used may be the four, as in the example illustrated or may be more or less than four. In some embodiments of the invention, it may be desirable to include detection of errors in these lesser bits. Likewise, in other applications the requirements to save chip area and reduce power consumption may make it desirable to include detection of metastable errors in fewer bits. similarly, for ADC of greater precision (conversion to greater number of bits), the number of latches and corresponding D flip flops would be determined based on the tradeoff between the desired accuracy of the corrected output and tolerance for metastable induced errors in less significant bits of the ADC output vs. the chip area and power consumption limitations for the ADC. Since the size of the metastability error is largest for the MSB and cut in half for each successive bit, it is most important to reduce metastability errors for the MSBs and less important for each successive bit. Thus, there is great value in the disclosed system detecting and correcting metastability errors in just a few of the MSBs of the conversion code.

Figure 8:
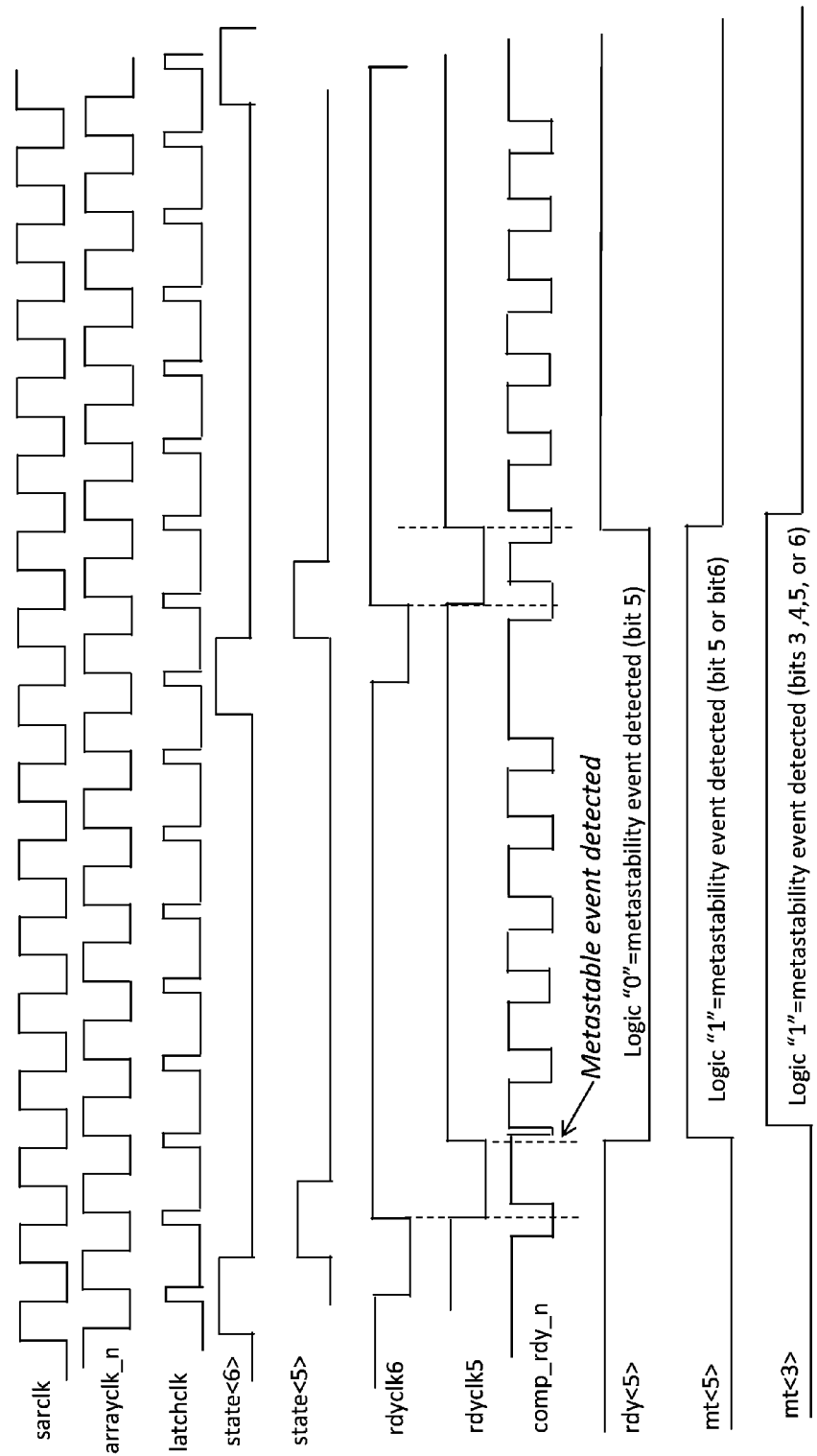
FIG. 8 is a timing diagram illustrating the signal timing in the successive approximation analog to digital converter system of FIG. 4.

Referring back to the first logic circuit 700 in FIG. 7 and the timing diagram in FIG. 8, the rising edge of rdyclk6 output from the output Q of latch 702 on line 710 will clock the comp_rdy_n signal into D flip flop 712. If the comparator is suffering from a metastable event, the comp_rdy_n signal will not have gone low at the time of the positive clock edge of the rdyclk6 signal and the D flip flop Q output rdy_n<6> will go high and therefore the Q output (inverted output) rdy<6> will go low. In a similar manner, if a metastability event occurs when the comparator is determining the value of the second bit is being determined, when D flip-flop 714 is clocked, the Q output thereof rdy_n<5> will go high while the Q output rdy<5> will go low. Similarly, D flip flop 716 will capture (provide a low Q output) if a metastability event happens while the comparator is determining bit 4, and D flip flop 718 will capture when a metastability event occurs when the comparator is determining bit 3.

A metastable event occurs when the differential voltage across the differential inputs of the comparator 500 in the SAR ADC is near 0V. At 0V, it does not matter whether the comparator chooses a 1 or a 0 since either choice is equally valid. At the metastable point, the problem is that the comparator does not make a choice within the required time period, and that can result in an error captured in the following bit. To preclude that problem, a metastability event is detected and stored for the first 4 MSBs, in this particular example. Decoding logic looks at these detection flops as well as the bits coming from the successive approximation register and determines the correct data word from these bits. Accordingly, once a metastability event is detected, captured in at least one of the D flip flops 712, 714, 716, and 718, the next step is to generate the correct code at the ADC output. Responsive to a metastabe event being detected, the bit being processed for which the event is detected is arbitrarily assigned a logic 1, since either choice of a 1 or 0 is equally correct, and the following lesser bits are all assigned a logic 0. It would be equally valid to assign a 0 to the bit associated with the metastability event and the less significant bits that follow would all be assigned a logic 1. The more significant bits which were determined before the metastability event was detected are kept as they were determined with no change.

The decoding of the correct data code when a metastable event is detected begins with the logic gate circuit 740 formed by the inverters 720, 724, 728 and 732, and NAND gates 722, 726, 730 and 734. The inverter 720 has a fixed logic 0 input to thereby maintain a logic 1 output that is coupled to one of the two inputs of the NAND gate 722. A fixed logic 1 input could alternately be input to NAND gate 722 if such were suitably available in the in the integrated circuit layout of the SAR ADC. When a metastable event is detected, the Q output rdy<n> (where n=the bit number) of the D flip flop which captures the event goes low, which will then force the NAND gate 722, 726, 730, or 734 to which it is connected to go high. The outputs of these NAND gates are labeled mt<6>, mt<5>, mt<4> and mt<3> in this 7 bit ADC example shown in FIG. 7 where the four most significant bits are monitored for the occurrence of a metastable event. The NAND gates are cascaded in a ripple fashion with intervening inverters, such that as soon one gate's output is set to a logic 1, all of the NAND gate outputs that follow in the cascade are forced to a logic 1. Obviously the number of cascaded gates will correspond to the number of D Flip Flops of the first logic circuit 700. As an example, when mt<4> is a logic 1, it indicates that a metastable event has occurred when determining either bit 4 or when determining one of the previous bits (bit 5, bit 6, or bit 7).

The decoding is now carried out in a second logic circuit 750 that includes NOR gates 752, 754, 756, 758, 760, 762, 764, 766, 768, 770, 772, 774, 776 and 778. The second logic circuit 750 makes use of the rdy_n<i> (where i=the bit number) signals output from the first logic circuit 700 and the mt<i> (where i=the bit number) signals from the logic gate circuit 740 to force the bit<6> through bit<0> data bits to be the correct data values to yield a valid conversion code as if the comparator had been able to make a correct decision within the allotted time period.

As an example, if, when determining the MSB, there is a metastable event, rdy_n<6> will be a logic 1 and therefore the inverted output signal rdy<6> input to NAND gate 722 will be a logic 0. With a fixed logic 1 on one input and the logic 0 on the other, NAND gate 722 outputs a logic 1 as mt<6> and the input to inverter 724. The logic 1 output of NAND gate 722 "ripples" through the cascaded gates so that mt<6> through mt<3> will be a logic 1. Using these inputs, the NOR gates 752 and 754 will force the data<6> output to be a logic 1. Since the rdy_n<6> is a logic 1, the output of NOR gate 752 will be a logic 0 and since the two inputs of NOR gate 754 are each a logic 0 (one input being fixed to a logic 0), the data<6> output is a logic 1. Since mt<6> is a logic 1, it will force data<5> at the output of NOR gate 758 to be a logic 0. In a similar manner, since mt<5>, mt<4>, and mt<3> are all at a logic 1, data<4>, data<3>, data<2>, data<1> and data<0> will all be forced to a logic 0. Hence, an output code of 1000000 will result at the ADC output, which is the correct offset binary code that should occur when the MSB is at the indeterminate transition point when determined by the comparator.

As a further example, if no metastability event occurs when bit 6 is determined, but rather a metastability event occurs when bit 5 is determined, the rdy<5> signal will go low (logic 0) on D flip flop 714 and the rdy_n<5> signal will therefore go to a logic 1. In this example, mt<6> will be a logic 0 while mt<5> will go to a logic 1, which will ripple down the cascaded NAND gates of the logic gate circuit 740 and set mt<4> and mt<3> to a logic 1 as well. The logic setting of D flip flop 712 and the decoding NOR gates 752 and 754 allow bit<6> to pass through to the ADC output data<6> unchanged. As the rdy_n<5> signal is high and mt<6> is low, the ADC output data 5 will be forced to be a logic 1. Each of mt<5>, mt<4>, and mt<3> being a logic 1 and will respectively force the ADC outputs data<4>, data<3>, data<2>, data<1> and data<0> to a logic 0. The output code will be whatever the MSB (bit<6>) was determined to be by the comparator followed by the code 100000 for the remaining bits which again is the correct code for the final 6 bits if a metastable event occurs while the comparator is determining bit<5>. As was the case for bit<6>, when no metastable event is detected, all of the ADC outputs, data<6>, data<5>, data<4>, data<3>, data<2>, data<1> and data<0> will be whatever was determined to be by the comparator.

When no metastable events are detected during determination of any of the bits, the rdy_n<i> signals will all be a logic 0 and therefore the mt<i> signals will all be a logic 0. With one input of each of NOR gates 752, 756, 760, 764, 768, 772 and 776 being at a logic 0, those gates will respectively track the corresponding bit<i> (where i=the bit number) signals, albeit in inverted form. As the mt<i> signals are all at a logic 0, the respective outputs of NOR gates 752, 756, 760, 764, 768, 772 and 776 will be passed through the corresponding NOR gates 754, 758, 762, 766, 770, 774 and 778 in inverted form to thereby pass the bit<i> signals unchanged through as the output signals data<i> (where i=the bit number).

The descriptions above are intended to illustrate possible implementations of the present invention and are not restrictive. While this invention has been described in connection with specific forms and embodiments thereof, it will be appreciated that various modifications other than those discussed above may be resorted to without departing from the spirit or scope of the invention. Such variations, modifications, and alternatives will become apparent to the skilled artisan upon review of the disclosure. For example, functionally equivalent elements or method steps may be substituted for those specifically shown and described, and certain features may be used independently of other features, and in certain cases, particular locations of elements or sequence of method steps may be reversed or interposed, all without departing from the spirit or scope of the invention as defined in the appended Claims. The scope of the invention should therefore be determined with reference to the description above and the appended claims, along with their full range of equivalents.

What is claimed is:

1. A system for detection and correction of metastability errors in a conversion of a sampled analog signal by a successive approximation analog to digital converter coupled to a reference generator, the successive approximation analog to digital converter including a clock generator coupled to a successive approximation register and a logic state machine, and a digital to analog converter coupled to the successive approximation register, the logic state machine and the reference generator, the system comprising:
  a comparator unit operatively coupled to the digital to analog converter and the sampled analog signal and having an output coupled to the successive approximation register, said comparator unit initiating a comparison of the sampled analog signal with a quantization level reference established by the digital to analog converter responsive to a comparator clocking signal, and after a time interval outputting a signal corresponding to said comparator unit latching a bit value respectively for each of a plurality of bit conversion states, said comparator unit outputting said latched bit value to the successive approximation register; and
  a metastability detection and correction circuit coupled to the successive approximation register, the logic state machine and the clock generator, said metastability detection and correction circuit being further coupled to said comparator unit for detecting a metastable event therein and outputting bit values received from the successive approximation register responsive to an absence of a metastable event and output of selected bit values responsive to detection of at least one metastable event within a processing cycle of the successive approximation analog to digital converter.

2. The system as recited in claim 1, where said metastability detection and correction circuit receives a logic signal from said comparator unit corresponding to latching of a respective bit value output by said comparator unit and detects a metastable event by an absence of said logic signal within a portion of a conversion time period of the successive approximation analog to digital converter.

3. The system as recited in claim 1, where said metastability detection and correction circuit outputs a logic high for a bit value coincident with said metastable event and a logic low for less significant bit values.

4. The system as recited in claim 2, where said metastability detection and correction circuit outputs a logic high for a bit value coincident with said metastable event and a logic low for less significant bit values for each subsequent bit conversion state of a corresponding processing cycle of the successive approximation analog to digital converter.

5. The system as recited in claim 1, where said comparator unit includes a comparator for comparing the sampled analog signal with the quantization level reference and a circuit coupled to the comparator for detecting a latched condition of the comparator and output of a logic signal to said metastability detection and correction circuit responsive to said comparator latching an output bit value.

6. The system as recited in claim 5, where said circuit for detecting a latched condition of the comparator is a NAND gate.

7. The system as recited in claim 2, where said metastability detection and correction circuit includes a first logic circuit having a respective flip flop for each of a plurality of bit conversion states for detecting a presence of said logic signal by a conclusion of a duration of a latch clock signal and detecting a metastable event responsive to an absence thereof, said flip flops being coupled to a logic gate circuit for output therefrom of a metastable event detection signal for any of said plurality of bit conversion states for which a metastable event is detected.

8. The system as recited in claim 7, where said metastability detection and correction circuit includes a second logic circuit coupled to said first logic circuit for outputting bit values received from the successive approximation register responsive to an absence of a metastable event being detected therefore and setting an output bit value corresponding to said bit conversion state for which a metastable event is detected to a logic high and each subsequent less significant bit conversion state of a corresponding processing cycle of the successive approximation analog to digital converter being set to a logic low.

9. The system as recited in claim 7, where said latch clock signal is derived from a first clock signal supplied from the clock generator to the successive approximation register and a second clock signal supplied from the clock generator to the logic state machine.

10. The system as recited in claim 5, where said metastability detection and correction circuit includes a first logic circuit having a respective flip flop for each of a plurality of bit conversion states for detecting a presence of said logic signal by a conclusion of a duration of a latch clock signal and detecting a metastable event responsive to an absence thereof, said flip flops being coupled to a logic gate circuit for output therefrom of a metastable event detection signal for any of said plurality of bit conversion states for which a metastable event is detected.

11. The system as recited in claim 10, where said metastability detection and correction circuit includes a second logic circuit coupled to said first circuit logic circuit for outputting bit values received from the successive approximation register responsive to an absence of a metastable event being detected therefore and setting an output bit value corresponding to said bit conversion state for which a metastable event is detected to a logic high and all less significant bit conversion states and a logic low for each subsequent bit conversion state of a corresponding processing cycle of the successive approximation analog to digital converter.

12. The system as recited in claim 10, where said latch clock signal is derived from a first clock signal supplied from the clock generator to the successive approximation register and a second clock signal supplied from the clock generator to the logic state machine.

13. The system as recited in claim 1, where the successive approximation analog to digital converter is one of a plurality of successive approximation analog to digital converters arranged for continuous successive conversion of multiple sequential samples of said analog voltage.

14. The system as recited in claim 13, where the plurality of successive approximation analog to digital converters are coupled to a single reference generator.

15. A system for detection and correction of metastability errors in a conversion of a sampled analog signal by a successive approximation analog to digital converter, comprising:
  a comparator unit for the successive approximation analog to digital converter having an output coupled to a successive approximation register of the successive approximation analog to digital converter, said comparator unit initiating a comparison of a sampled analog signal with a quantization level reference established by the successive approximation analog to digital converter responsive to a comparator clocking signal, and subsequently outputting a signal corresponding to said comparator unit latching a bit value respectively for each of a plurality of sequential bit conversion states of the successive approximation analog to digital converter, said comparator unit outputting said latched bit value to the successive approximation register; and
  a metastability detection and correction circuit coupled to the successive approximation register, the logic state machine and a clock generator, said metastability detection and correction circuit being further coupled to said comparator unit for detecting a metastable event therein and outputting bit values received from the successive approximation register responsive to an absence of a metastable event and output of selected bit values responsive to detection of at least one metastable event within a processing cycle of the successive approximation analog to digital converter to provide an output bit value within each conversion time period of the processing cycle of the successive approximation analog to digital converter.

16. The system as recited in claim 15, where said metastability detection and correction circuit receives a logic signal from said comparator unit corresponding to latching of a respective bit value output by said comparator unit for a respective bit conversion state and detects said metastable event by an absence of said logic signal within a portion of a corresponding conversion time period of the successive approximation analog to digital converter for the respective bit conversion state.

17. The system as recited in claim 15, where said metastability detection and correction circuit outputs a logic high for a bit value coincident with said metastable event and a logic low for less significant bit values for each subsequent bit conversion state of a corresponding processing cycle of the successive approximation analog to digital converter.

18. The system as recited in claim 16, where said metastability detection and correction circuit outputs a logic high for a bit value coincident with said metastable event and a logic low for less significant bit values for each subsequent bit conversion state of a corresponding processing cycle of the successive approximation analog to digital converter.

19. The system as recited in claim 15, where said comparator unit includes a comparator for comparing the sampled analog signal with the quantization level reference and a circuit coupled to the comparator for detecting a latched condition of the comparator and output of a logic signal to said metastability detection and correction circuit responsive to said comparator latching an output bit value.

20. The system as recited in claim 16, where said metastability detection and correction circuit includes a first logic circuit having a respective flip flop for each of a plurality of bit conversion states for detecting a presence of said logic signal by a conclusion of a duration of a latch clock signal and detecting said metastable event responsive to an absence thereof, said flip flops being coupled to a logic gate circuit for output therefrom of a metastable event detection signal for any of said plurality of bit conversion states for which said metastable event is detected.

21. The system as recited in claim 20, where said metastability detection and correction circuit includes a second logic circuit coupled to said first circuit logic circuit for outputting bit values received from the successive approximation register responsive to an absence of said metastable event being detected therefore and setting an output bit value corresponding to said bit conversion state for which said metastable event is first detected to a logic high and all less significant bit conversion states to a logic low for each subsequent bit conversion state of a corresponding processing cycle of the successive approximation analog to digital converter.

22. The system as recited in claim 19, where said metastability detection and correction circuit includes a first logic circuit having a respective flip flop of each of a plurality of bit conversion states for detecting a presence of said logic signal by a conclusion of a duration of a latch clock signal and detecting said metastable event responsive to an absence thereof, said flip flops being coupled to a logic gate circuit for output therefrom of a metastable event detection signal for any of said plurality of bit conversion states for which said metastable event is detected.

23. The system as recited in claim 22, where said metastability detection and correction circuit includes a second logic circuit coupled to said first circuit logic circuit for outputting bit values received from the successive approximation register responsive to an absence of said metastable event being detected therefore and setting an output bit value corresponding to said bit conversion state for which said metastable event is detected to a logic high and each subsequent less significant bit conversion state of a corresponding processing cycle of the successive approximation analog to digital converter being set to a logic low.

24. A method of detecting and correcting metastability errors in a successive approximation analog to digital converter, comprising the steps of:
  sampling an analog voltage;
  sequentially establishing a quantization level reference for each of a plurality of bit conversion states of a processing cycle using a successive approximation algorithm;
  using a comparator to sequentially perform a clocked comparison between said sampled analog voltage and said quantization level reference for each said bit conversion state;
  determining whether the comparator has latched an output bit value within a portion of a conversion time period and defining an occurrence of a metastable event for a respective bit conversion state responsive to a failure of the comparator to latch an output bit value within the portion of the conversion time period, connecting a logic circuit to the comparator for output of a logic signal responsive to detecting said latching of an output bit value, and using a clocked flip flop for each bit conversion state configured to receive said logic signal and a timing signal for detecting a presence of said logic signal by a conclusion of said portion of a conversion time period and detecting said metastable event responsive to an absence thereof; and setting a value of an output bit corresponding to said respective bit conversion state coincident with said metastable event to a logic one and each less significant bit value sequentially thereafter within the processing cycle to a logic zero.

\* \* \* \* \*